United States Patent
Lin et al.

(10) Patent No.: US 9,568,935 B2
(45) Date of Patent: Feb. 14, 2017

(54) CURRENT DETECTION CIRCUIT AND POWER INTEGRATED CIRCUIT

(71) Applicant: Fitipower Integrated Technology, Inc., Hsinchu (TW)

(72) Inventors: Chih-Ho Lin, Hsinchu (TW); Wen-Yen Lee, Hsinchu (TW); Yi-Sheng Liu, Hsinchu (TW); Chio-Yi Ho, Hsinchu (TW)

(73) Assignee: Fitipower Integrated Technology, Inc., Hsinchu (TW)

( * ) Notice: Subject to any disclaimer, the term of this patent is extended or adjusted under 35 U.S.C. 154(b) by 0 days.

(21) Appl. No.: 14/843,652

(22) Filed: Sep. 2, 2015

(65) Prior Publication Data

US 2016/0224051 A1    Aug. 4, 2016

(30) Foreign Application Priority Data

Feb. 2, 2015    (TW) .............................. 104103488 A

(51) Int. Cl.
  *G05F 3/26* (2006.01)
  *G01R 19/165* (2006.01)
(52) U.S. Cl.
  CPC ......... *G05F 3/262* (2013.01); *G01R 19/16519* (2013.01); *G01R 19/16576* (2013.01)
(58) Field of Classification Search
  CPC .................................................... G05F 3/262
  See application file for complete search history.

(56) References Cited

U.S. PATENT DOCUMENTS

| 4,553,084 | A | * | 11/1985 | Wrathall | ................ | G01R 17/06 |
| | | | | | | 323/314 |
| 5,877,617 | A | * | 3/1999 | Ueda | ....................... | G05F 3/247 |
| | | | | | | 323/315 |
| 5,903,422 | A | * | 5/1999 | Hosokawa | ......... | G01R 19/0092 |
| | | | | | | 327/427 |
| 7,009,403 | B2 | * | 3/2006 | Graf | .................... | G01R 19/0092 |
| | | | | | | 323/278 |
| 7,813,096 | B2 | * | 10/2010 | Takahashi | .......... | H03K 17/0822 |
| | | | | | | 361/87 |
| 2010/0052647 | A1 | * | 3/2010 | Forghani-Zadeh | .. | H03K 17/122 |
| | | | | | | 323/349 |
| 2011/0193541 | A1 | * | 8/2011 | Nakahara | ................... | G05F 1/10 |
| | | | | | | 323/282 |

* cited by examiner

*Primary Examiner* — Emily P Pham
(74) *Attorney, Agent, or Firm* — Zhigang Ma

(57) ABSTRACT

A current detection circuit includes a first detection circuit, a second detection circuit, and a control selection circuit. The first detection circuit electrically connects between an input terminal and an output terminal and outputs a first detection signal. The second detection circuit electrically connects between the input terminal and the output terminal and outputs a second detection signal. The control selection circuit electrically connects the output terminal, the first detection circuit, and the second detection circuit and selects one of the first and second detection signals as a detection signal.

20 Claims, 3 Drawing Sheets

CURRENT DETECTION CIRCUIT AND POWER INTEGRATED CIRCUIT

FIELD

The subject matter herein generally relates to current detection technologies, and particularly to a power integrated circuit with a current detection circuit.

BACKGROUND

Power integrated circuits are widely applied in electrical devices, for example, linear regulators, chargers, and switch mode regulators, widely applied in mobile communication devices, portable computers, and personal computers, and so on. These power integrated circuits provide drive voltages and drive currents.

BRIEF DESCRIPTION OF THE DRAWINGS

Implementations of the present technology will now be described, by way of example only, with reference to the attached figures.

DETAILED DESCRIPTION

Figure 1:
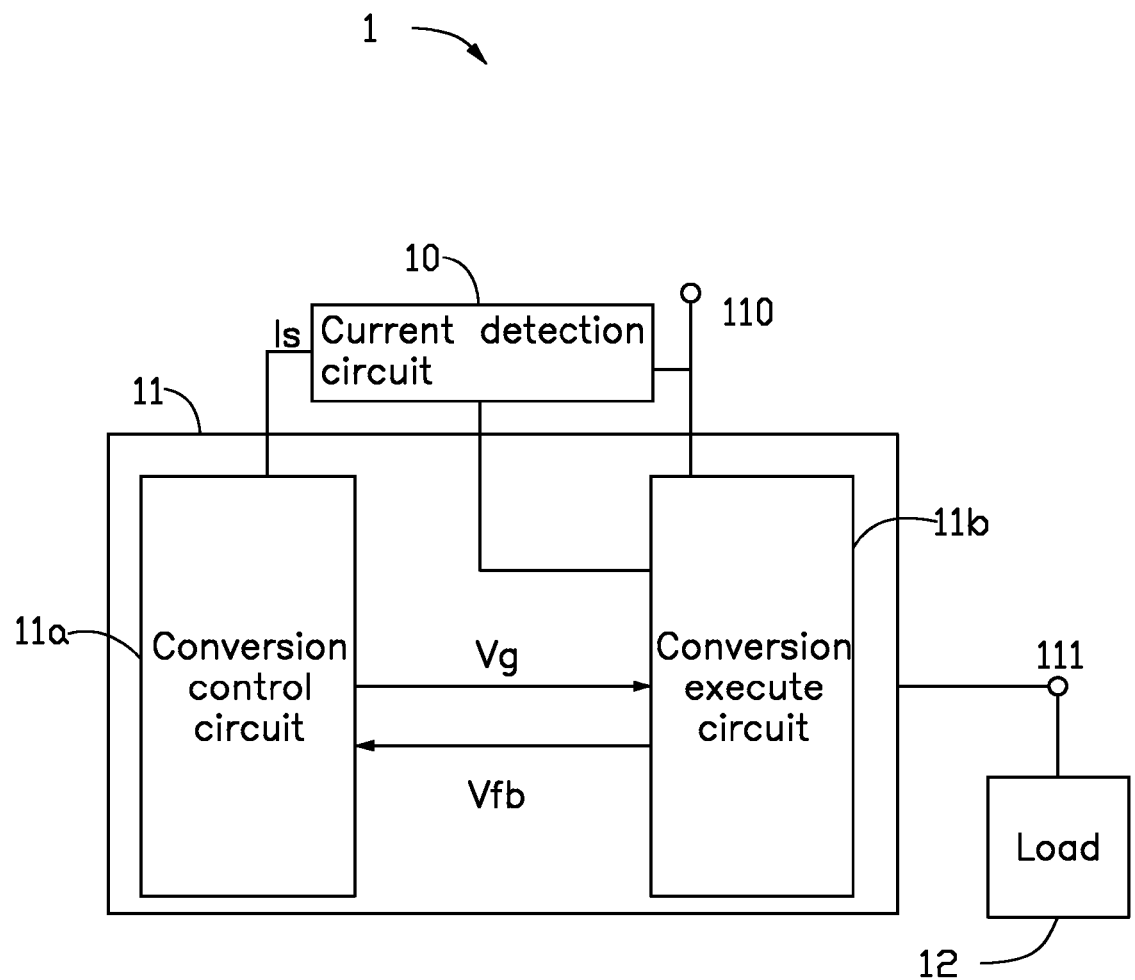
FIG. 1 is a block diagram illustrating an embodiment of a power integrated circuit of the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. The drawings are not necessarily to scale and the proterminalions of certain parts may be exaggerated to better illustrate details and features. The description is not to be considered as limiting the scope of the embodiments described herein.

Several definitions that apply throughout this disclosure will now be presented.

The term "comprising" means "including, but not necessarily limited to"; it specifically indicates open-ended inclusion or membership in a so-described combination, group, series and the like.

Referring to FIG. 1, an embodiment of a power integrated circuit 1 is shown. The power integrated circuit 1 includes a current detection circuit 10 and a voltage conversion circuit 11. The voltage conversion circuit 11 includes a first input terminal 110 and a first output terminal 111. The first input terminal 110 is configured to receive a first input voltage $V_{in}$. The voltage conversion circuit 11 is configured to convert the first input voltage $V_{in}$ into a first output voltage $V_{out}$, such that a first output current $I_{out}$ is obtained at the first output terminal 111. The first output voltage $V_{out}$ and the first output current $I_{out}$ are both provided to a load 12. The load 12 may be a central processing unit, a display circuit, a timing circuit, etc. The current detection circuit 10 is configured to detect the first output current $I_{out}$ and then feed back a detection signal $I_S$ to the voltage conversion circuit 11.

The voltage conversion circuit 11 further includes a conversion control circuit 11a and a conversion execute circuit 11b. The conversion execute circuit 11b is configured to transmit the first input voltage $V_{in}$ to the first output terminal 111. The conversion control circuit 11a is configured to output an activating signal $V_g$ to the conversion execute circuit 11b, so as to activate the conversion execute circuit 11b to convert voltage. The conversion control circuit 11a is further configured to control the conversion execute circuit 11b according to the work condition of the conversion execute circuit 11b, such that the first output voltage $V_{out}$ and the first output current $I_{out}$ precisely fall into a predetermined range. The work condition of the conversion execute circuit 11b is represented by a feedback signal $V_{fb}$. The intensity and frequency of the feedback signal $V_{fb}$ depend on the change of the first output voltage $V_{out}$ and the first output current $I_{out}$ output from the conversion execute circuit 11b and also depend on the change of the voltage and the current of a node of the conversion execute circuit 11b. In other embodiments, the feedback signal $V_{fb}$ can be omitted. The conversion execute circuit 11b can further perform voltage conversion, such as, low dropout voltage regulation, boost conversion or buck conversion, etc.

Figure 2:
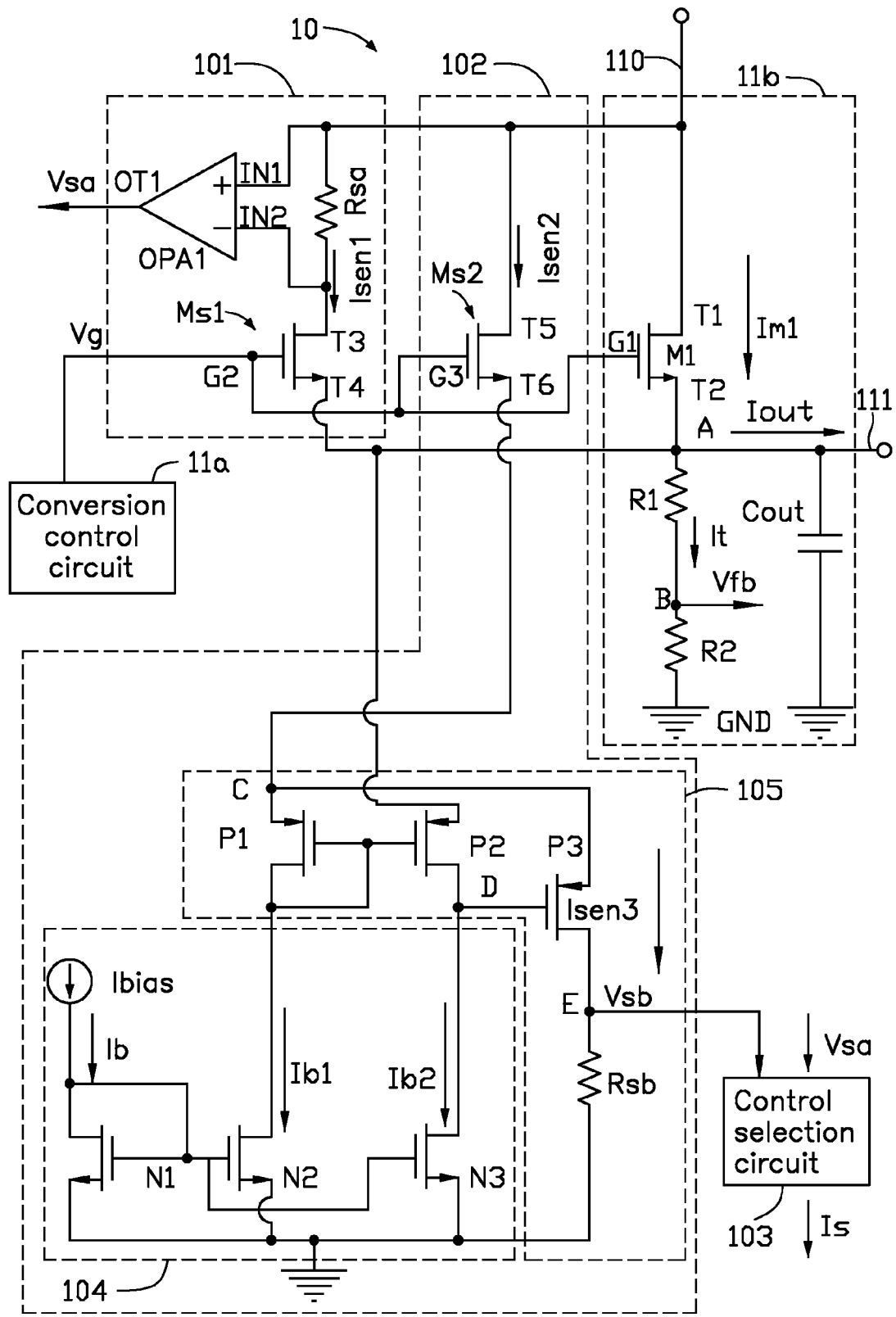
FIG. 2 is a circuit diagram illustrating the power integrated circuit of FIG. 1.

FIG. 2 illustrates a partial circuit structure of the power integrated circuit 1 of FIG. 1. The conversion execute circuit 11b includes a main control transistor M1, a first conversion resistance R1, a second conversion resistance R2, and an output capacitor $C_{out}$. The main control transistor M1 is electrically connected to the first input terminal 110 and configured to receive the first input voltage $V_{in}$ from the first input terminal 110. The main control transistor M1 is electrically connected to the first output terminal 111 and configured to output the first output voltage $V_{out}$ and the first output current $I_{out}$ to the first output terminal 111. The main control transistor M1 is electrically connected to the conversion control circuit 11a and configured to receive the activating signal $V_g$. The main control transistor M1 transmits the first input voltage $V_{in}$ from the first input terminal 110 to the first output terminal 111 under the control of the activating signal $V_g$ provided by the conversion control circuit 11a. The activating signal $V_g$ also controls the current going through the main control transistor M1.

In at least one embodiment, the main control transistor M1 includes a main control electrode G1, two main transmission electrodes T1, T2. The main control electrode G1 is electrically connected to the conversion control circuit 11a. The main transmission electrodes T1, T2 are electrically and individually connected to the first input terminal 110 and a node A. The first output terminal 111 is also directly and electrically connected to the node A. As a result, the voltage of the node A is equal to the first output voltage $V_{out}$. In the illustrated embodiment, the main control electrode G1 is a gate electrode, the main transmission electrode T1 is a drain electrode, and the main transmission electrode T2 is a source electrode. When the main control M1 is turned on, the first input voltage $V_{in}$ is applied to the main transmission electrode T1 and a main control current $I_{m1}$ goes through the main control transistor M1. The main control transistor M1 is a N type metal oxide semiconductor field effect transistor. A size of the gate electrode G1 is represented by a ratio of width to length: W1/L1.

The first conversion resistance R1 and the second conversion resistance R2 are serially connected between the node A and the ground GND. The first conversion resistance R1 and the second conversion resistance R2 are configured to convert the first input voltage $V_{in}$. A conversion current $I_t$ goes through the first conversion resistance R1 and the second conversion resistance R2.

In other embodiments, the conversion execute circuit 11b can only apply a single resistance for converting the first input voltage $V_{in}$ or the two resistances R1, R2 can be omitted.

The output capacitor $C_{out}$ is electrically connected between the node A and the ground GND. The output capacitor $C_{out}$ is configured to filter the voltage converted by the first conversion resistance R1 and the second conversion resistance R2, so as to obtain the first output voltage $V_{out}$ and the first output current $I_{out}$ with low noise. The sum of the conversion current $I_t$ and the first output current $I_{out}$ is equal to the main control current $I_{m1}$, i.e., $I_{out}=I_{m1}-I_t$. To ensure the conversion efficient of the conversion execute circuit 11b, the conversion current $I_t$ is much less than the first output current $I_{out}$, i.e., $I_t \ll I_{out}$, such that the first output current $I_{out}$ is almost equal to the main control current $I_{m1}$, i.e., $I_{out} \approx I_{m1}$. The phrase "much less than" here means that the difference between the conversion current $I_t$ and the first output current $I_{out}$ is at least 3 magnitudes.

In at least one embodiment, a node B between the first conversion resistance R1 and the second conversion resistance R2 is treated as a feedback node. The voltage of the node B or the current going through the node B can be treated as the feedback signal $V_{fb}$, the voltage of the node B is formulated by: $V_{out} \times R2/(R1+R2)$.

The conversion control circuit 11a can be a logical integrated circuit and configured to output the activating signal $V_g$ to the main control electrode G1 of the main control transistor M1, so as to control the main control transistor M1 to turn on or turn off and control the current going through the main control transistor M1 when the main control transistor M1 being turned on. As a result, the first output voltage $V_{out}$ and the first output current $I_{out}$ are adjusted by the main control transistor M1. At the same time, the conversion control circuit 11a receives the detection signal $I_s$ and the feedback signal $V_{fb}$ from the current detection circuit 10 and further adjusts the activating signal $V_g$ according to the detection signal $I_s$ and the feedback signal $V_{fb}$, such that the first output voltage $V_{out}$ and the first output current $I_{out}$ fall in the predetermined range.

The current detection circuit 10 includes a first detection circuit 101, a second detection circuit 102, and a control selection circuit 103. The first detection circuit 101 and the second detection circuit 102 are both electrically connected between the first input terminal 110 and the first output terminal 111. The first detection circuit 101 is configured to output a first detection signal S1 according to the detected first output current $I_{out}$. The second detection circuit 102 is configured to output a second detection signal S2 according to the detected first output current $I_{out}$. The control selection circuit 103 is electrically connected to the first output terminal 111, the first detection circuit 101, and the second detection circuit 102. When the first output voltage $V_{out}$ is less than a predetermined first reference voltage $V_{ref}$, the control selection circuit 103 selects the first detection signal S1 as the detection signal $I_s$. When the first output voltage $V_{out}$ is greater than the first reference voltage $V_{ref}$, the control selection circuit 103 selects the second detection signal S2 as the detection signal $I_s$. When the first output voltage $V_{out}$ is too small to drive the second detection circuit 102 to work, the control selection circuit 103 selects the first detection signal S1 from the first detection circuit 101 as the detection signal $I_s$. When the first output voltage $V_{out}$ is great enough to drive the second detection circuit 102 to work, the control selection circuit 103 selects the second detection signal S2 from the second detection circuit 102 as the detection signal $I_s$, such that the current detection circuit 10 precisely outputs the detection signal $I_s$ when the first output voltage $V_{out}$ has a large range.

In at least one embodiment, the first detection circuit 101 includes a first detection resistance $R_{sa}$, a first detection transistor $M_{s1}$, and a first operation amplifier OPA1.

One end of the first detection resistance $R_{sa}$ is electrically connected to the first input terminal 110, and another end of the first detection resistance $R_{sa}$ is electrically connected to the first detection transistor $M_{s1}$. The first detection resistance $R_{sa}$ is configured to detect a first detection current $I_{sen1}$ going through the first detection transistor $M_{s1}$ and further converts the first detection current $I_{sen1}$ into a first detection voltage.

The drain electrode T3 of the first detection transistor $M_{s1}$ is electrically connected to the first detection resistance $R_{sa}$, the source electrode T4 of the first detection transistor $M_{s1}$ is electrically connected to the node A, and the gate electrode G2 of the first detection transistor $M_{s1}$ is electrically connected to the conversion control circuit 11a, so as to control the first detection transistor $M_{s1}$ to be turned on or off under the control of the activating signal $V_g$ from the conversion control circuit 11a. When the first detection transistor $M_{s1}$ is turned on, the current going through the first detection transistor $M_{s1}$ is treated as the first detection current $I_{sen1}$. In other embodiments, the first detection transistor Ms1 can be an N type metal oxide semiconductor field effect transistor and the size of the gate electrode G2 can be represented by W2/L2.

In at least one embodiment, the ratio of the size of the gate electrode G1 to the size of the gate electrode G2 is formulated by: W1/L1:W2/L2=1:m, wherein m is less than 1. As a result, when the main control transistor M1 and the first detection transistor $M_{s1}$ are in the same state, for example, the activating voltages $V_g$ applied to the main control transistor M1 and the first detection transistor $M_{s1}$ are the same to each other, the ratio of the main control current $I_{m1}$ going through the main control transistor M1 and the first detection current $I_{sen1}$ going through the first detection transistor $M_{S1}$ is represented by: $I_{m1}:I_{sen1}(I_{out})$=W1/L1:W2/L2=1:m. The main control current $I_{m1}$ going through the main control transistor M1 is linearly proportional to the first detection current $I_{sen1}$ going through the first detection transistor $M_{s1}$.

The first operation amplifier OPA1 includes a non-inverting input terminal IN1, an inverting input terminal IN2, and an operation output terminal OT1. The non-inverting input terminal IN1 is electrically connected to the first input terminal 110. The inverting input terminal IN2 is electrically connected to the drain electrode T3 of the first detection transistor $M_{s1}$, i.e., the non-inverting input terminal IN1 and the inverting input terminal IN2 are individually and electrically connected to two ends of the first detection resistance $R_{sa}$. The first operation amplifier OPA1 is configured to treat the first detection voltage $V_{sa}$ as the first detection signal S1 and output the first detection signal S1. The first detection voltage $V_{sa}$ is equal to the product of the first detection resistance $R_{sa}$ multiplying the first detection current $I_{sen1}$, i.e., $V_{sa}=R_{sa}*I_{sen1}$. The value of the first detection resistance $R_{sa}$ is constant, and therefore, the first detection voltage $V_{sa}$ is linearly proportional to the first detection current $I_{sen1}$.

The second detection circuit 102 includes a second detection transistor $M_{s2}$, a reference current generation unit 104, and a transferring unit 105.

The second detection transistor $M_{s2}$ is also configured to detect the first output current $I_{out}$. The gate electrode G3 of the second detection transistor $M_{s2}$ is electrically connected to the conversion control circuit 11a and configured to control the second detection transistor $M_{s2}$ to be turned on or off under the control of the activating signal $V_g$ from the conversion control circuit 11a. When the second detection transistor $M_{s2}$ is turned on, the current going through the second detection transistor $M_{s2}$ is treated as the second detection current $I_{sen2}$ and the second detection current $I_{sen2}$ is much less than the first output current $I_{out}$. The drain electrode T5 of the second detection transistor $M_{s2}$ is electrically connected to the first input terminal 110 and configured to receive the first input voltage $V_{in}$. The source electrode of the second detection transistor Ms2 is electrically connected to the transferring unit 105. A node C is positioned between the source electrode of the second detection transistor Ms2 and the transferring unit 105. In one embodiment, the second detection transistor Ms2 can be an N type metal oxide semiconductor field effect transistor. The size of the gate electrode G3 is the same as the size of the gate electrode G2 and the size of the gate electrode G3 can also be represented by W2/L2. The sum of the on-resistance value of the first detection transistor $M_{s1}$ and the on-resistance value of the second detection transistor $M_{s2}$ is much greater than the on-resistance value of the main control transistor M1.

As a result, when the main control transistor M1 and the second detection transistor $M_{s2}$ are in the same state, for example, the same activating voltages $V_g$ are applied to the gate electrodes of the main control transistor M1 and the second detection transistor $M_{s2}$, the ratio of the main control current $I_m$ going through the main control transistor M1 to the second detection current $I_{sen2}$ going through the second detection transistor $M_{s2}$ can be represented by: $I_m:I_{sen2}(I_{out})$ =W1/L1:W2/L2=1:m. In other words, the main control current $I_m$ going through the main control transistor M1 is linearly proportional to the second detection current $I_{sen2}$ going through the second detection transistor $M_{s2}$.

The reference current generation unit 104 is configured to provide a first mirror current Ib1 and a second mirror current Ib2 to the transferring unit 105. The first mirror current Ib1 is linearly proportional to the second mirror current Ib2. In the illustrated embodiment, the reference current generation unit 104 includes a feed-through current supply Ibias, a first reference transistor N1, a second reference transistor N2, and a third reference transistor N3. The current going through the second reference transistor N2 is the first mirror current Ib1 and the current going through the third reference transistor N3 is the second mirror current Ib2. The feed-through current supply Ibias provides a feed-through current Ib.

The drain electrode of the first reference transistor N1 is electrically connected to the feed-through current supply Ibias, the gate electrode of the first reference transistor N1 is electrically connected to the second reference transistor N2, and the source electrode of the first reference transistor N1 is electrically connected to the ground GND. The gate electrode of the first reference transistor N1 is directly and electrically connected to the drain electrode of the first reference transistor N1, such that the current going through the first reference transistor N1 is equal to the feed-through current Ib.

The drain electrode of the second reference transistor N2 is electrically connected to the transferring unit 105, the gate electrode of the second reference transistor N2 is electrically connected to the gate electrode of the first reference transistor N1, and the source electrode of the second reference transistor N2 is electrically connected to the ground.

The drain electrode of the third reference transistor N3 is electrically connected to the transferring unit 105, the gate electrode of the third reference transistor N3 is electrically connected to the gate electrode of the first reference transistor N1, and the source electrode of the third reference transistor N3 is electrically connected to the ground.

The size of the gate electrode of the second reference transistor N2 is represented by W3/L3, the size of the gate electrode of the third reference transistor N3 is represented by W4/L4, the ratio of the size of the gate electrode of the second reference transistor N2 to the size of the gate electrode of the third reference transistor N3 is represented by W3/L3:W4/L4=n. As a result, the first mirror current Ib1 going through the second reference transistor N2 is linearly proportional to the second mirror current Ib2 going through the third reference transistor N3, i.e., Ib1:Ib2=W3/L3:W4/L4=n.

In one embodiment, the first reference transistor N1, the second reference transistor N2, and the third reference transistor N3 are all N type metal oxide semiconductor field effect transistors. The first mirror current Ib1 going through the second reference transistor N2 is equal to the second mirror current Ib2 going through the third reference transistor N3, or the ratio of the first mirror current Ib1 going through the second reference transistor N2 to the second mirror current Ib2 going through the third reference transistor N3 is: Ib1:Ib2=W3/L3:W4/L4=n, wherein n is constant.

The transferring unit 105 is configured to make the voltage Vc of the node C equal to the voltage Va of the node A. The transferring unit 105 includes a first transferring transistor P1, a second transferring transistor P2, and a third transferring transistor P3, and a second detection resistance $R_{sb}$.

The source electrode of the first transferring transistor P1 is electrically connected to the node C, the gate electrode and the drain electrode of the first transferring transistor P1 are directly and electrically connected to each other and are both connected to the drain electrode of the second reference transistor N2, such that the first transferring transistor P1 is connected like a diode and is in a fully on state. When the first transferring transistor P1 is on, the current going through the source electrode and the drain electrode of the first transferring transistor P1 is equal to the first mirror current Ib1. In the illustrated embodiment, the first transferring transistor P1 is a P type metal oxide semiconductor field effect transistor. The size of the gate electrode of the first transferring transistor P1 is represented by W5/L5.

The gate electrode of the second transferring transistor P2 is electrically connected to the gate electrode of the first transferring transistor P1, the source electrode of the second transferring transistor P2 is electrically connected to the node A, and the drain electrode of the second transferring transistor P2 is electrically connected to the drain electrode of the third reference transistor N3. A node D is positioned between the drain electrode of the second transferring transistor P2 and the drain electrode of the third reference transistor N3. When the second transferring transistor P2 is on, the current going through the source electrode and the drain electrode of the second transferring transistor P2 is equal to the second mirror current Ib2. In the illustrated embodiment, the second transferring transistor P2 is a P type metal oxide semiconductor field effect transistor. The size of the gate electrode of the second transferring transistor P2 is represented by W6/L6.

The first transferring transistor P1 and the second transferring transistor P2 constitute a current mirror circuit. The size of the gate electrode of the first transferring transistor P1 is equal to the size of the gate electrode of the second transferring transistor P2, i.e., W5/L5:W6/L6=1, such that a bridge voltage $V_{gs}$ between the source electrode and the gate electrode of the first transferring transistor P1 is equal to a bridge voltage $V_{gs}$ between the source electrode and the gate electrode of the second transferring transistor P2, such that the voltage $V_c$ of the node C is equal to the voltage $V_a$ of the node A. Because the voltage of the node A is equal to the first output voltage $V_{out}$, the voltage $V_c$ of the node C is also equal to the first output voltage $V_{out}$.

The gate electrode of the third transferring transistor P3 is electrically connected to the drain electrode of the second transferring transistor P2, so as to further connect to the node D. The source electrode of the third transferring transistor P3 is electrically connected to the node C, and the drain electrode of the third transferring transistor P3 is electrically connected to the second detection resistance $R_{sb}$. When the third transferring transistor P3 is on, the current going through the third transferring transistor P3 is treated as the third detection current $I_{sen3}$. The third detection current can be represented by: $I_{sen3}=I_{sen2}-Ib1$.

The second detection resistance $R_{sb}$ is serially connected to the third transferring transistor P3. The second detection resistance $R_{sb}$ is configured to detect the third detection current $I_{sen3}$ and convert the third detection current $I_{sen3}$ into the second detection voltage $V_{sb}$ and output the second detection voltage $V_{sb}$ as the second detection signal. One end of the second detection resistance $R_{sb}$ is electrically connected to the drain electrode of the third transferring transistor P3. A node E is positioned between the second detection resistance $R_{sb}$ and the third transferring transistor P3. Another end of the second detection resistance $R_{sb}$ is electrically connected to the ground. The voltage applied to two ends of the second detection resistance $R_{sb}$, i.e., the voltage of the node E, is treated as a second detection voltage $V_{sb}$. The second detection voltage is represented by: $V_{sb}=R_{sb}\times I_{sen3}=R_{sb}\times(I_{sen2}-Ib1)$, and therefore, the second detection voltage $V_{sb}$ is linearly proportional to the second detection current $I_{sen2}$.

Figure 3:
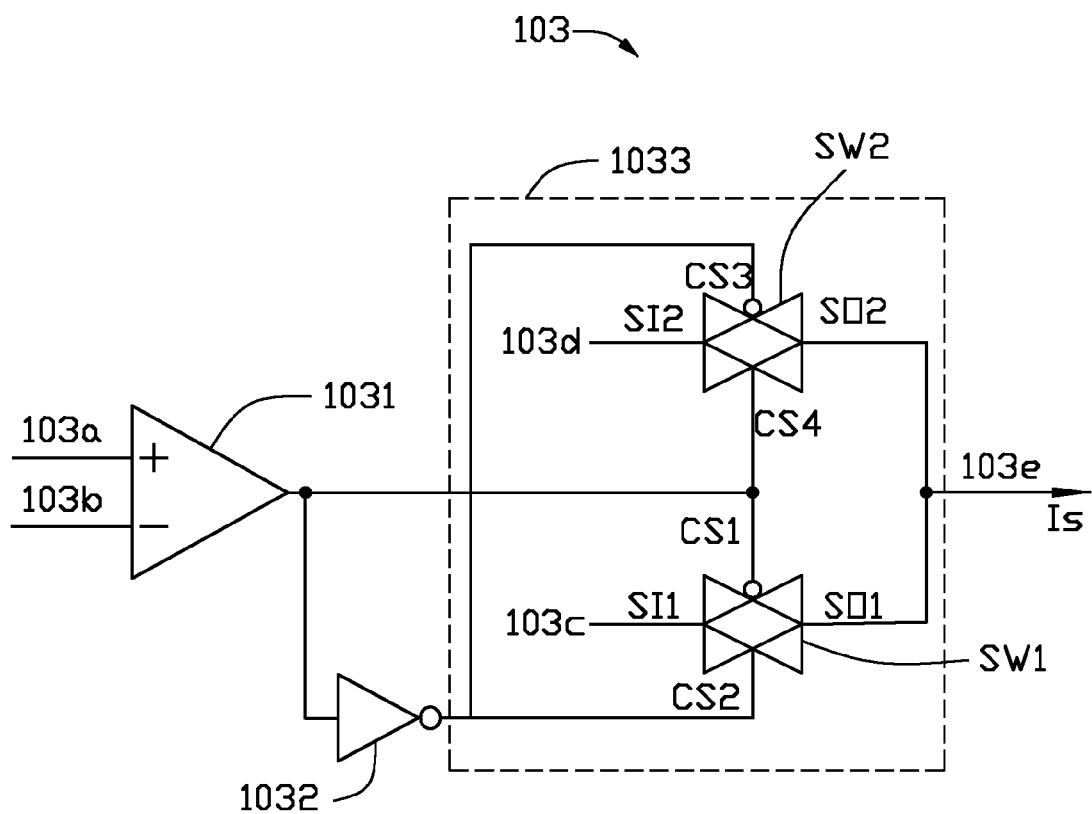
FIG. 3 is a circuit diagram illustrating a control selection circuit of the power integrated circuit of FIG. 1.

FIG. 3 illustrates an embodiment of the control selection circuit 103 of FIG. 2. The control selection circuit 103 includes an input terminal 103a, a reference voltage input terminal 103b, a first detection signal input terminal 103c, a second detection signal input terminal 103d, and a detection signal output terminal 103e.

The input terminal 103a is electrically connected to the first output terminal 111 and configured to receive the first output voltage $V_{out}$. The reference voltage input terminal 103b is electrically connected to a reference power supply and configured to receive a reference voltage $V_{ref}$. The reference voltage $V_{ref}$ is greater than or equal to the activating voltage of the first transferring transistor P1 and the second transferring transistor P2. The value difference of the first input voltage $V_{in}$ and the reference voltage $V_{ref}$ is greater than the second activating voltage of the first detection transistor $M_{s1}$ and the second detection transistor $M_{s2}$. In one embodiment, the reference voltage Vref is equal to the activating voltage of the first transferring transistor P1.

The first signal detection input terminal 103c is electrically connected to the operation output terminal OT1 and configured to receive the first detection voltage $V_{sa}$. The second detection input terminal 103d is electrically connected to the node E and configured to receive the second detection voltage $V_{sb}$.

The control selection circuit 103 selectively outputs one of the first detection voltage $V_{sa}$ and the second detection voltage $V_{sb}$ by comparing the first output voltage $V_{out}$ to the reference voltage $V_{ref}$.

The control selection circuit 103 includes a comparator 1031, an inverter 1032, and a selection circuit 1033. A non-inverting input terminal of the comparator 1031 is electrically connected to the input terminal 103a, an inverting input terminal is electrically connected to the reference voltage input terminal 103b, and an output terminal of the comparator 1031 is electrically connected to an input terminal of the inverter 1032 and the selection circuit 1033. An output terminal of the inverter 1032 is electrically connected to the selection circuit 1033.

The selection circuit 1033 includes a first selection unit SW1 and a second selection unit SW2. The first selection unit SW1 includes a first control terminal CS1, a second control terminal CS2, a first signal input terminal SI1, and a first signal output terminal SO1. The first control terminal CS1 is electrically connected to the output terminal of the comparator 1031. The second control terminal CS2 is electrically connected to the output terminal of the inverter 1032. The first signal input terminal SI1 is electrically connected to the first signal detection input terminal 103c and configured to receive a first detection voltage $V_{sa}$. The first signal output terminal SO1 is electrically connected to the signal detection output terminal 103e and configured to output a first detection voltage $V_{sa}$.

The first control terminal CS1 is an inverting input terminal, while the second control terminal CS2 is a non-inverting input terminal. When a low potential signal is applied to the first control terminal CS1 and a high potential signal is applied to the second control terminal CS2, the first selection unit SW1 is on and the first detection voltage $V_{sa}$ is output to the signal detection output terminal 103e; when the high potential signal is applied to the first control terminal CS1 and the low potential signal is applied to the second control terminal CS2, the first selection unit SW1 is off and the first detection voltage $V_{sa}$ is not output to the signal detection output terminal 103e.

The second selection unit SW2 includes a third control terminal CS3, a fourth control terminal CS4, a second signal input terminal SI2, and a second signal output terminal SO2. The third control terminal CS3 is electrically connected to the output terminal of the inverter 1032, and the fourth control terminal CS4 is electrically connected to the output terminal of the comparator 1031. The second signal input terminal SI2 is electrically connected to the second signal detection input terminal 103d and configured to receive the second detection voltage $V_{sb}$. The second signal output terminal SO2 is electrically connected to the signal detection output terminal 103e and configured to selectively output the second detection voltage $V_{sb}$ to the signal detection output terminal 103e.

Similarly, the third control terminal CS3 is an inverting input terminal and the fourth control terminal CS4 is a non-inverting input terminal. When a low potential signal is applied to the third control terminal CS3 and a high potential signal is applied to the fourth control terminal CS4, the second selection unit SW2 is on and the second detection voltage $V_{sb}$ is output to the signal detection output terminal 103e; when the high potential signal is applied to the third control terminal CS3 and the low potential signal is applied to the fourth control terminal CS4, the second selection unit SW2 is off and the second detection voltage $V_{sb}$ is not output to the signal detection output terminal 103e.

In one embodiment, the first selection unit SW1 and the second selection unit SW2 each constitute a PMOS transistor and an NMOS transistor. The source electrode of the PMOS transistor and the source electrode of the NMOS transistor are both electrically connected to the first signal input terminal SI1 or the second signal input terminal SI2. The drain electrode of the PMOS transistor and the drain electrode of the NMOS transistor are both electrically connected to the first signal output terminal SO1 or the second signal output terminal SO2. The gate electrode of the PMOS transistor is treated as an inverting input terminal, just like the first control terminal CS1 and the third control terminal CS3. The gate electrode of the NMOS transistor is treated as a non-inverting input terminal, just like the second control terminal CS2 and the fourth control terminal CS4.

FIG. 2 also illustrates a working process of the power integrated circuit 1. When the power integrated circuit 1 is powered and the first output voltage $V_{out}$ is less than the reference voltage $V_{ref}$, the control selection circuit 103 turns the first selection unit SW1 on and turns the second selection unit SW2 off, the first detection voltage $V_{sa}$ is output to the signal detection output terminal 103e, and the first detection voltage $V_{sa}$ corresponding to the first detection current $I_{sen1}$ is treated as the detection signal Is.

The conversion control circuit 11a adjusts the activating signal $V_g$ according to the detection signal Is, so as to precisely control the first output voltage $V_{out}$ and the first output current $I_{out}$ to fall in the predetermined range.

When the first output voltage $V_{out}$ is less than the reference voltage $V_{ref}$, the control selection circuit 103 selects the first detection voltage Vsa from the first detection 101 as the detection signal Is. At this time, the main control transistor M1, the first detection transistor Ms1, and the second detection transistor Ms2 are all turned on under the control of the activating signal Vg, the voltage difference between the drain electrode and the source electrode of the second detection transistor Ms2 is much greater than the second activating voltage, the main control transistor M1, the first detection transistor Ms1, and the second detection transistor Ms2 are all fully turned on. When the main control transistor M1 and the first detection transistor Ms1 are both fully turned on, the current going through the main control transistor M1 and the first detection transistor Ms1 is not related to the voltage applied to the main control transistor M1 and the voltage applied between the source electrode and the drain electrode of the first detection transistor Ms1. As a result, the ratio of the first output current $I_{out}$ going through the main control transistor M1 to the first detection current $I_{sen1}$ is precisely kept to be 1:m.

When the first output voltage $V_{out}$ is greater than the reference voltage $V_{ref}$, the control selection circuit 103 turns the first selection unit SW1 off and turns the second selection unit SW2 on, the second detection voltage $V_{sb}$ is output to the signal detection output terminal 103e and the second detection voltage $V_{sb}$ corresponding to the second detection current $I_{sen2}$ is treated as the detection signal Is. The conversion control circuit 11a adjusts the activating signal Vg according to the detection signal Is.

When the first output voltage $V_{out}$ is greater than the reference voltage $V_{ref}$, the control selection circuit 103 selects the second detection voltage $V_{sb}$ from the second detection circuit 102 as the detection signal. At this time, because the first output voltage $V_{out}$ is greater than the reference voltage $V_{ref}$, the first output voltage $V_{out}$ is much greater than the activating voltage of the three transferring transistors P1, P2, P3. As a result, the first transferring transistor P1, the second transferring transistor P2, and the third transferring transistor P3 are all normally working and precisely output the third detection current $I_{sen3}$.

When the voltage of the node C is equal to the voltage of the node A, the voltage applied to the source electrode of the main control transistor M1 is equal to the voltage applied to the source electrode of the second detection transistor Ms2, so as to assure that the voltage between the source electrode and the drain electrode of the main control transistor M1 is equal to the voltage between the source electrode and the drain electrode of the second detection transistor Ms2 and the ratio of the first output current $I_{out}$ going through the main control transistor M1 to the second detection current $I_{sen2}$ is precisely kept to be 1:m.

When the first output voltage $V_{out}$ is small, for example, less than the reference voltage $V_{ref}$, the first output voltage $V_{out}$ cannot drive the transistors of the transferring unit 105 to work, such that the second detection circuit 102 cannot work or cannot precisely output the second detection voltage $V_{sb}$. But the selection control circuit 103 selects the first detection voltage Vsa from the first detection circuit 101 as the detection signal Is, so as to ensure the accuracy of the detection signal Is.

When the first output voltage $V_{out}$ is greater than the reference voltage $V_{ref}$, the control selection circuit 103 selects the second detection voltage $V_{sb}$ as the detection signal Is, so as to prevent the first detection transistor Ms1 and the main control transistor M1 from being linearly turned on if the value difference between the first output voltage $V_{out}$ and the input voltage $V_{in}$ is small. Because of the first detection resistance $R_{sa}$, the voltage applied to the first detection transistor Ms1 is different from the voltage applied to the main control transistor M1, such that the ratio of the first output current $I_{out}$ to the first detection current $I_{sen1}$ cannot precisely be kept to be 1:m.

Therefore, whenever the first output voltage $V_{out}$ falls in any range, the power detection circuit 10 can ensure that the ratio of the first detection current $I_{sen1}$ to the first output current $I_{out}$ and the ratio of the second detection current $I_{sen2}$ to the first out current $I_{out}$ are both kept to be 1:m, so as to ensure the accuracy of the detection signal Is.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size and arrangement of the parts within the principles of the present disclosure up to, and including, the full extent established by the broad general meaning of the terms used in the claims.

What is claimed is:

1. A current detection circuit for detecting a first output current from a voltage conversion circuit and further outputting a detection signal corresponding to the first output current, the voltage conversion circuit comprising a first input terminal for receiving a first input voltage and a first output terminal, the voltage conversion circuit converting the first input voltage into a first output voltage, the first output voltage and the first output current both going through a loading circuit from the first output terminal, the current detection circuit comprising:

a first detection circuit configured to electrically connect between the first input terminal and the first output terminal and output a first detection signal according to a detected first output current;

a second detection circuit configured to electrically connect between the first input terminal and the first output terminal and output a second detection signal according to the detected first output current; and a control selection circuit configured to electrically connect to the first output terminal, the control selection circuit electrically connecting the first detection circuit and the second detection circuit;

wherein when the first output voltage is less than a predetermined reference voltage, the control selection circuit selects the first detection signal as a detection signal and when the first output voltage is greater than the first reference voltage, the control selection circuit selects the second detection signal as a detection signal.

2. The current detection circuit of claim 1, wherein when the first output voltage is less than the reference voltage, the first detection signal more precisely represents the first output current than the second detection signal; when the first output voltage is greater than the reference voltage, the second detection signal more precisely represents the first output current than the first detection signal.

3. The current detection circuit of claim 2, wherein the first detection circuit comprises:

a first detection resistance configured to electrically connect to the first input terminal;

a first detection transistor, a drain electrode of the first detection transistor electrically connecting the to first detection resistance, a source electrode of the first detection transistor configured to electrically the first output terminal, a gate electrode of the first detection transistor configured to receive an activating signal and be turned on or off under the control of the activating signal, the first detection transistor configured to detection a main control current going through a main control transistor of the voltage conversion circuit and further output the first detection current, the first detection resistance converting the first detection current into a first detection voltage;

a first operation amplifier comprising two input ends, the two input ends electrically and individually connecting to two ends of the first detection resistance, the first operation amplifier configured to output the first detection voltage as the first detection signal, the first detection voltage linearly proportional to the first detection current.

4. The current detection circuit of claim 2, wherein the second detection circuit comprises a second detection transistor, a reference current generation unit, and a transferring unit, the second detection transistor is configured to detect the first output current and output a second detection current according to the first output current, a gate electrode of the second detection transistor is configured to receive the activating signal and be turned on or off under the control of the activating signal, a drain electrode of the second detection transistor is configured to electrically connect to the first input terminal, a source electrode of the second detection transistor electrically connects to the transferring unit, the reference current generation unit electrically connects to the transferring unit and is configured to provide a reference current to the transferring unit, the transferring unit makes the voltage of the source electrode of the second detection transistor equal to the voltage of the first output terminal, the transferring unit outputs a second detection voltage according to the second detection current and outputs the second detection voltage as the second detection signal, the second detection voltage is linearly proportional to the second detection current.

5. The current detection circuit of claim 4, wherein the second detection current is linearly proportional to the main control current.

6. The current detection circuit of claim 4, wherein a ration of the width to the length of a gate electrode of the main control transistor is represented by W1/L1, a ration of the width to the length of a gate electrode of the first detection transistor is represented by W2/L2, W1/L1:W2/L2=1:m, m is less than 1.

7. The current detection circuit of claim 6, wherein the reference current generation unit comprises a feed-through current supply, a first reference transistor, a second reference transistor, a third reference transistor, the current going through the second reference transistor is a first mirror current, the current going through the third reference transistor is a second mirror current, a drain electrode of the first reference transistor is electrically connected to the feed-through current supply, a gate electrode of the first reference transistor is electrically connected to the second reference transistor, a source electrode of the first reference transistor is electrically connected to the ground, the gate electrode and the drain electrode of the first reference transistor are electrically connected to each other, a drain electrode of the second reference transistor is electrically connected to the transferring unit, a gate electrode of the second reference transistor is electrically connected to the gate electrode of the first reference transistor, a source electrode of the second reference transistor is electrically connected to the ground, a drain electrode of the third reference transistor is electrically connected to the transferring unit, a gate electrode of the third reference transistor is electrically connected to the gate electrode of the first reference transistor, a source electrode of the third reference transistor is electrically connected to the ground.

8. The current detection circuit of claim 7, wherein a size of the gate electrode of the second reference transistor is linearly proportional to a size of the gate electrode of the third reference transistor.

9. The current detection circuit of claim 8, wherein the transferring unit comprises a first transferring transistor and a second transferring transistor, a source electrode of the first transferring transistor is electrically connected to the source electrode of the second detection transistor, a gate electrode and a drain electrode of the first transferring transistor are electrically connected to each other, the gate electrode of the first transferring transistor is electrically connected to the drain electrode of the second reference transistor, a gate electrode of the second transferring transistor is electrically connected to the gate electrode of the first transferring transistor, a source electrode of the second transferring transistor is configured to electrically connect to the first output terminal, a drain electrode of the second transferring transistor is electrically connected to the drain electrode of the third reference transistor, and a size of the gate electrode of the first transferring transistor is equal to a size of the gate electrode of the second transferring transistor.

10. The current detection circuit of claim 9, wherein the transferring unit comprises a third transferring transistor and a second detection resistance, a gate electrode of the third transferring transistor is electrically connected to the drain electrode of the second transferring transistor, a source electrode of the third transferring transistor is electrically connected to the source electrode of the second detection transistor, a drain electrode of the third transferring transistor is electrically connected to the ground through the second detection resistance, the third transferring transistor outputs a third detection current according to the second detection current, the second detection resistance converts the third detection current into a second detection voltage, and the second detection voltage is linearly proportional to the second detection current.

11. The current detection circuit of claim 2, wherein the control selection circuit comprises an input terminal, a reference voltage input terminal, a first signal detection input terminal, a second signal detection input terminal, and a signal detection output terminal, the input terminal is configured to electrically connect to the first input terminal, the reference voltage input terminal is configured to receive the reference voltage, the reference voltage is greater than or equal to the activating voltage of the first transferring transistor and the second transferring transistor, the first signal detection input terminal receives the first detection voltage, the second signal detection input terminal receives the second detection voltage, the control selection circuit selectively outputs one of the first detection voltage and the second detection voltage through the signal detection output terminal by comparing the first output voltage and the reference voltage.

12. The current detection circuit of claim 11, wherein the control selection circuit comprises a comparator, an inverter, and a selection circuit, a non-inverting input terminal of the comparator is electrically connected to the input terminal, an inverting input terminal of the comparator is electrically connected to the reference voltage input terminal, an output terminal of the comparator is electrically connected to an input end of the inverter and the selection circuit, and an output terminal of the inverter is electrically connected to the selection circuit.

13. The current detection circuit of claim 12, wherein the selection circuit comprises a first selection unit and a second selection unit, the first selection unit comprises a first control terminal, a second control terminal, a first signal input terminal, and a first signal output terminal, the first control terminal is electrically connected to the output terminal of the comparator, the second control terminal is electrically connected to the output terminal of the inverter, the first signal input terminal is electrically connected to the first signal detection input terminal and configured to receive the first detection voltage, the first signal output terminal is electrically connected to the signal detection output terminal and configured to output the first detection voltage, the second selection unit comprises a third control terminal, a fourth control terminal, a second signal input terminal, and a second signal output terminal, the third control terminal is electrically connected to the output terminal of the inverter, the fourth control terminal is electrically connected to the output terminal of the comparator, the second signal input terminal is electrically connected to the second signal detection input terminal and configured to receive the second detection voltage, the second signal output terminal is electrically connected to the signal detection output terminal and configured to selectively output the second detection voltage to the signal detection output terminal.

14. The current detection circuit of claim 13, wherein the first control terminal and the third control terminal are both inverting input terminals, the second control terminal and the fourth control terminal are both non-inverting input terminals, when a low potential signal is applied to the first control terminal and the fourth control terminal and a high potential signal is applied to the second control terminal and the third control terminal, the first selection unit is turned on, the second selection unit is turned off, and the first detection voltage is output through the signal detection output terminal; when the high potential signal is applied to the first control terminal and the fourth control terminal and the low potential signal is applied to the second control terminal and the third control terminal, the first selection unit is turned off, the second selection unit is turned on, and the second detection voltage is output through the signal detection output terminal.

15. A power integrated circuit, comprising:
a voltage conversion circuit comprising:
a first input terminal configured to receive a first input voltage;
a first output terminal configured to output a first output voltage and a first output current corresponding to the first output voltage;
a conversion control circuit; and
a conversion execute circuit configured to convert the first input voltage into the output voltage, the conversion execute circuit comprising a main control transistor and an output capacitor, the main control transistor electrically connected between the first input terminal and the first output terminal, the output capacitor electrically connected between the first output terminal and the ground; and
a current detection circuit configured to detect the first output current from the voltage conversion circuit and further output a detection signal corresponding to the first output current, the current detection circuit comprising:
a first detection circuit electrically connecting between the first input terminal and the first output terminal and configured to output a first detection signal according to a detected first output current;
a second detection circuit electrically connecting between the first input terminal and the first output terminal and configured to output a second detection signal according to the detected first output current; and
a control selection circuit electrically connecting to the first output terminal, the control selection circuit electrically connecting to the first detection circuit and the second detection circuit, wherein when the first output voltage is less than a predetermined reference voltage, the control selection circuit selects the first detection signal as a detection signal; when the first output voltage is greater than the reference voltage, the control selection circuit selects the second detection signal as a detection signal; the conversion control circuit is electrically connected to the conversion execute circuit and the current detection circuit and configured to control the first output current to fall into a predetermined range according to the detection signal.

16. The power integrated circuit of claim 15, wherein the conversion execute circuit comprises at least one conversion resistance, the at least one conversion resistance is electrically connected between the first output terminal and the ground and configured to transmit the first input voltage from the first input terminal to the first output terminal, the value of the at least one conversion resistance is greater than the value of the on-resistance of the main control transistor.

17. The power integrated circuit of claim 15, wherein when the first output voltage is less than the reference voltage, the first detection signal more precisely represents the first output current than the second detection signal; when the first output voltage is greater than the reference voltage, the second detection signal more precisely represents the first output current than the first detection signal.

18. The power integrated circuit of claim 17, wherein the first detection circuit comprises:
- a first detection resistance electrically connecting to the first input terminal;
- a first detection transistor, a drain electrode of the first detection transistor electrically connecting to the first detection resistance, a source electrode of the first detection transistor electrically connecting to the first output terminal, a gate electrode of the first detection transistor configured to receive an activating signal and be turned on or off under the control of the activating signal, the first detection transistor configured to detect the main control current going through the main control transistor and further output the first detection current, the first detection resistance converting the first detection current into a first detection voltage;
- a first operation amplifier comprising two input ends, the two input ends electrically and individually connecting to two ends of the first detection resistance, the first operation amplifier configured to output the first detection voltage as the first detection signal, the first detection voltage linearly proportional to the first detection current.

19. The power integrated circuit of claim 17, wherein the second detection circuit comprises a second detection transistor, a reference current generation unit, and a transferring unit, the second detection transistor is configured to detect the first output current and output a second detection current according to the first output current, a gate electrode of the second detection transistor is configured to receive the activating signal and be turned on or off under the control of the activating signal, a drain electrode of the second detection transistor electrically connects to the first input terminal, a source electrode of the second detection transistor electrically connects to the transferring unit, the reference current generation unit electrically connects to the transferring unit and is configured to provide a reference current to the transferring unit, the transferring unit makes the voltage of the source electrode of the second detection transistor equal to the voltage of the first output terminal, the transferring unit outputs a second detection voltage according to the second detection current and outputs the second detection voltage as the second detection signal, the second detection voltage is linearly proportional to the second detection current.

20. The power integrated circuit of claim 19, wherein the second detection current is linearly proportional to the main control current.

* * * * *